US007864976B2

(12) United States Patent
Kitazawa et al.

(10) Patent No.: US 7,864,976 B2
(45) Date of Patent: Jan. 4, 2011

(54) SPEAKER

(75) Inventors: Hideo Kitazawa, Nagano (JP); Akinori Ushikoshi, Nagano (JP); Takamasa Kaneko, Shizuoka (JP); Kenji Yokoyama, Tokyo (JP)

(73) Assignee: Nidec Pigeon Corporation (JP)

( * ) Notice: Subject to any disclaimer, the term of this patent is extended or adjusted under 35 U.S.C. 154(b) by 1247 days.

(21) Appl. No.: 11/447,332

(22) Filed: Jun. 6, 2006

(65) Prior Publication Data

US 2006/0290481 A1 Dec. 28, 2006

(30) Foreign Application Priority Data

Jun. 7, 2005 (JP) ............................ 2005-167530

(51) Int. Cl.
*H04R 1/00* (2006.01)
*G01R 3/00* (2006.01)

(52) U.S. Cl. ....................... 381/407; 381/396; 381/400; 381/410; 29/595

(58) Field of Classification Search ................. 381/407, 381/410
See application file for complete search history.

(56) References Cited

U.S. PATENT DOCUMENTS 4,727,586 A * 2/1988 Johnson ...................... 381/186
4,924,858 A * 5/1990 Katona .......................... 601/4

FOREIGN PATENT DOCUMENTS

| | | | |
|---|---|---|---|
| JP | 52-79644 | | 7/1977 |
| JP | 53-12319 | | 2/1978 |
| JP | 53-12320 | | 2/1978 |
| JP | 53-12321 | | 2/1978 |
| JP | 57014280 | * | 1/1982 |
| JP | 08205285 | * | 8/1996 |

* cited by examiner

*Primary Examiner*—Brian Ensey
*Assistant Examiner*—Sunita Joshi
(74) *Attorney, Agent, or Firm*—Cantor Colburn LLP

(57) ABSTRACT

A speaker may include a voice coil bobbin and a center pole. The voice coil bobbin may include a nonmetallic pipe body as a base of the voice coil bobbin, a first nonmagnetic and electric conductor film which is formed on an inner peripheral face of the pipe body, and a second electric conductor film which is formed on an outer peripheral face of the pipe body such that the first electric conductor film is covered by the second electric conductor film through the pipe body. An electrostatic capacity that is formed between the voice coil bobbin and the center pole is detected and outputted as an electric signal.

7 Claims, 6 Drawing Sheets

SPEAKER

CROSS REFERENCE TO RELATED APPLICATION

The present invention claims priority under 35 U.S.C. §119 to Japanese Application No. 2005-167530 filed Jun. 7, 2005, the contents of which are incorporated herein by reference.

FIELD OF THE INVENTION

An embodiment of the present invention may relate to a speaker. More specifically, an embodiment of the present invention may relate to a speaker which detects an operating state of the diaphragm of the speaker.

BACKGROUND OF THE INVENTION

In some audio speakers, a Motion Feed Back ("MFB") circuit is mounted as a technique to improve the sound quality of the speaker. The MFB circuit detects the operating state of a vibrating diaphragm through an electric signal showing audio information (hereinafter referred to as an "audio signal") that is inputted to a speaker, and feedback-controls the diaphragm based on the detected result. The distortion of sound, which is especially likely to be occurred in a low tone range, can be canceled. Therefore, it is sometimes mistakenly assumed that the MFB circuit is effective to be utilized in a small-sized speaker in which reproduction in a low tone range is difficult.

For example, the following five references with regard to an MFB circuit are known; Japanese Patent Laid-Open No. Sho 52-79644, Japanese Patent Laid-Open No. Sho 53-12319, Japanese Patent Laid-Open No. Sho 53-12320, Japanese Patent Laid-Open No. Sho 53-12321, and Japanese Utility Model Laid-Open No. Sho 57-96589. In these references, the operating state of the diaphragm is detected by detecting the variation of an electrostatic capacity formed between electrodes. More specifically, an electrode (hereinafter, referred to as "movable electrode") is fixed to a diaphragm or to an electromagnetic coil which is referred to as a voice coil bobbin and that causes the diaphragm to vibrate, and another electrode (hereinafter, referred to as "fixed electrode") is fixed so as to face the movable electrode. An electrostatic capacity, which is varied by the movable electrode being moved relative to the fixed electrode, is detected and outputted as a detection signal. After that, the detection signal corresponding to the electrostatic capacity and an audio signal are compared with each other by a comparison device (for example, a CPU), and then the operation of the diaphragm is appropriately controlled on the basis of the compared result, i.e., the difference between the output level of the detection signal and the output level of the audio signal.

However, the electrostatic capacity that is formed between the electrodes is very small, for example, from several picofarad (pF) to several hundred of pF. Therefore, the electrostatic capacity is affected and varied by a small amount of electromagnetic waves, static electricity, or the like. For example, a diaphragm is commonly structured to vibrate by an excitation effect between a voice coil bobbin, an iron core that is inserted into the voice coil bobbin and referred to as a center pole, and a magnet that generates a magnetic flux passing through the voice coil bobbin and the center pole. However, the electrostatic capacity between the electrodes is affected and varied by an exciting current flowing through the voice coil bobbin. Further, some of electronic components that are incorporated into a speaker emit an electromagnetic wave although it may be weak, and the electrostatic capacity may be varied by the electromagnetic wave that transmits to the electrodes. Further, the electrostatic capacity between the electrodes may be affected by friction accompanied with mechanical phenomena such as vibration of components which are incorporated in the speaker, static electricity caused by various electromagnetic phenomena in the inside and the outside of the speaker, electromagnetic waves which are outputted by electronic equipment installed around the speaker, or the like. As described above, in the above-mentioned prior art, the electrostatic capacity varies and the electrostatic capacity formed between the electrodes is unable to be accurately detected.

Further, a movable electrode used in the above-mentioned references is made of a metal foil. The metal foil is moved in a reciprocating manner in a constant magnetic field to generate an eddy current and thus a correct electrostatic capacity is not obtained. Therefore, an operating state of the diaphragm cannot be accurately detected and thus distortion of a sound in a low tone range is not sufficiently reduced.

BRIEF DESCRIPTION OF THE INVENTION

In view of the problems described above, an embodiment of the present invention may advantageously provide a speaker in which an electrostatic capacity formed between electrodes can be accurately detected without being affected by disturbance noise such as an electromagnetic wave or static electricity.

Thus, according to an embodiment of the present invention, there may be provided a speaker comprising a voice coil bobbin which is provided with a nonmetallic pipe body as a base of the voice coil bobbin, a first nonmagnetic and electric conductor film which is formed on the inner peripheral face of the pipe body, and a second electric conductor film which is formed on the outer peripheral face of the pipe body such that the first electric conductor film is covered by the second electric conductor film through the pipe body, and a center pole. An electrostatic capacity that is formed between the voice coil bobbin and the center pole is detected and is outputted as an electric signal.

Therefore, in this speaker, since the second electric conductor film may block an electromagnetic wave from the outside, an electrostatic capacity which is formed between the first electric conductor film and the center pole is maintained and thus the variation of the electrostatic capacity which is formed between the voice coil bobbin and the center pole can be accurately detected. Further, reliability of a detected result is enhanced. As a result, for example, the detected result is effectively utilized in the MFB circuit and sound distortion from a speaker which is a conventional problem can be reduced. Accordingly, a low tone range similar to one found in a large speaker can be realized even in a small speaker.

In accordance with an embodiment, insulator films are formed on the first and the second electric conductor films. When an insulator film is formed on the first electric conductor film, relative permittivity can be enhanced. In other words, an electrostatic capacity formed between the first electric conductor film and the center pole increases, and thus an effect of disturbance noise can be reduced. In addition, since the electrostatic capacity increases, even when a weak electromagnetic wave reaches from the outside, its effect can be reduced and thus a stable detection result can be obtained. In addition, when an insulator film is formed on the second electric conductor film, the second electric conductor film can be electrically insulated from disturbance noise. Further, for example, a lead wire that is wound around the voice coil bobbin and the second electric conductor film can be electrically insulated by the insulator film. Therefore, a state in which a current flowing through the lead wire conducts to the first and the second electric conductor films is prevented. As a result, a stable detection result can be obtained. Specifically, an inner side insulator film is formed on the inner peripheral face of the first electric conductor film, an electrostatic capacity that is formed between the first electric conductor film and the center pole is detected, an outer side insulator film is formed on the outer peripheral face on the second electric conductor film, and a coil is wound around the outer peripheral face of the outer side insulator film to structure the voice coil bobbin.

In accordance with an embodiment, the second electric conductor film is grounded. According to this embodiment, for example, the effect of an AC current flowing through a coil included in the voice coil bobbin or the effect of an electromagnetic wave from the outside can be reduced by the second electric conductor film.

Further, in accordance with an embodiment, at least one of the first electric conductor film and the second electric conductor film is laminated. According to this embodiment, each layer of laminated electric conductor films cuts a circuit through which an eddy current flows and an eddy current is effectively confined in each of the films. Therefore, an eddy current can be suppressed. For example, it is preferable that the first electric conductor film is formed with a plurality of electric conductor films which are laminated.

Further, in accordance with an embodiment, at least one of the first electric conductor film and the second electric conductor film is formed with at least one of a plurality of slits and a plurality of holes. According to this embodiment, a loop of eddy current formed in the electric conductor film is cut by a plurality of slits or a plurality of holes and thus an eddy current can be suppressed. Specifically, it is preferable that one film of the first electric conductor film that is comprised of a plurality of electric conductor films is formed of a foil member and the foil member is provided with at least one of a plurality of slits and a plurality of holes for suppressing an eddy current in a substantially equal interval manner.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENTS

An example of a speaker will be described in detail below with reference to the accompanying drawings.

Figure 1:
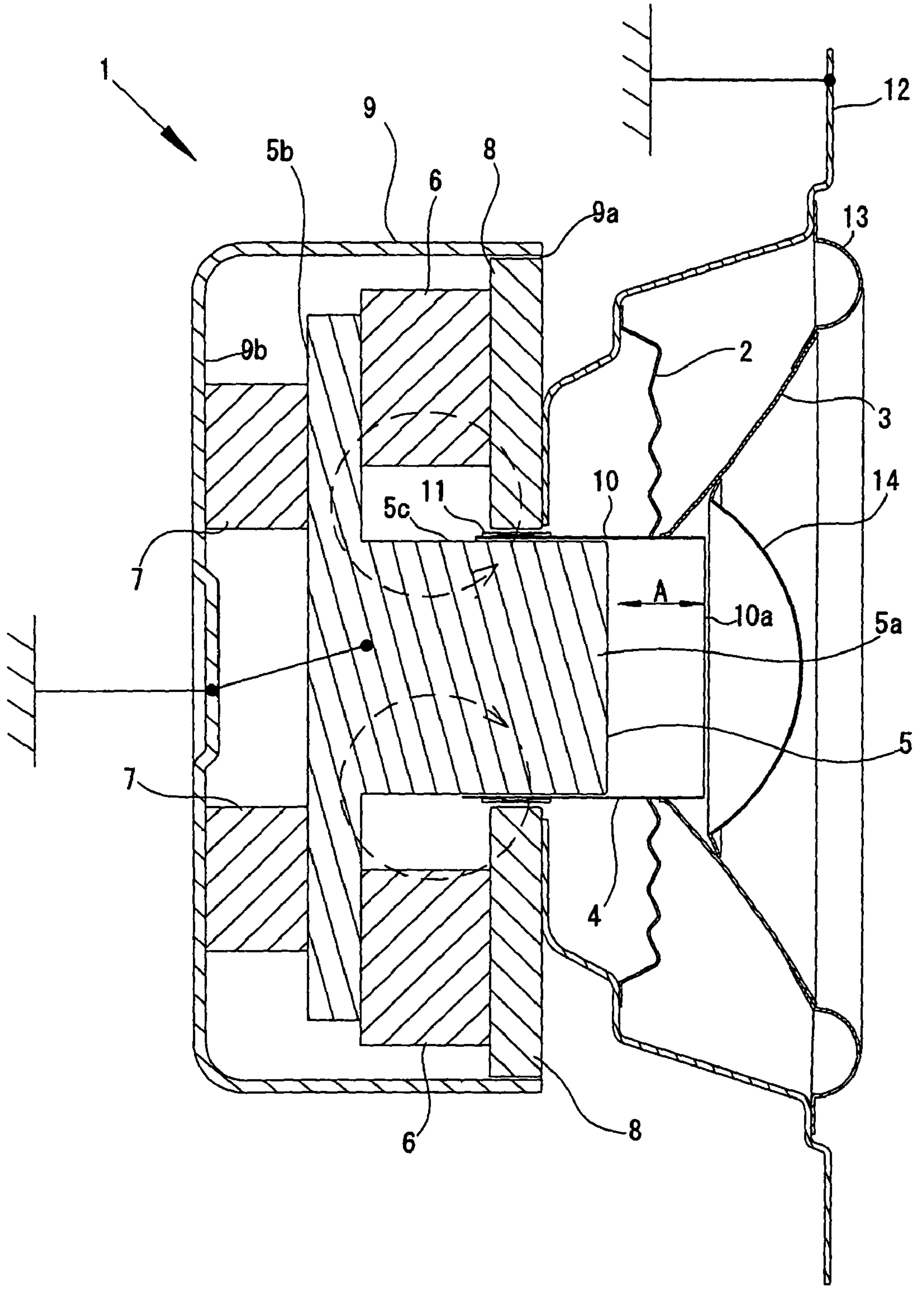
FIG. 1 is a cross-sectional view showing a structure of a speaker in accordance with an embodiment of the present invention.
Figure 2:
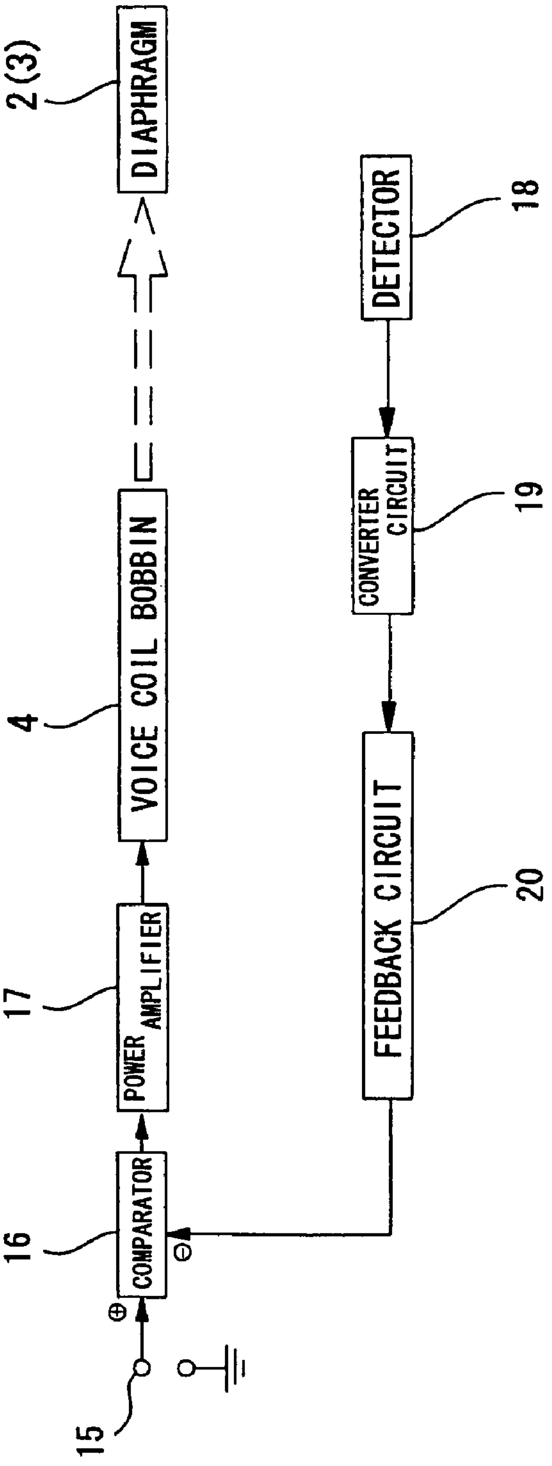
FIG. 2 is a functional block diagram showing an electrical structure of a speaker.
Figure 3:
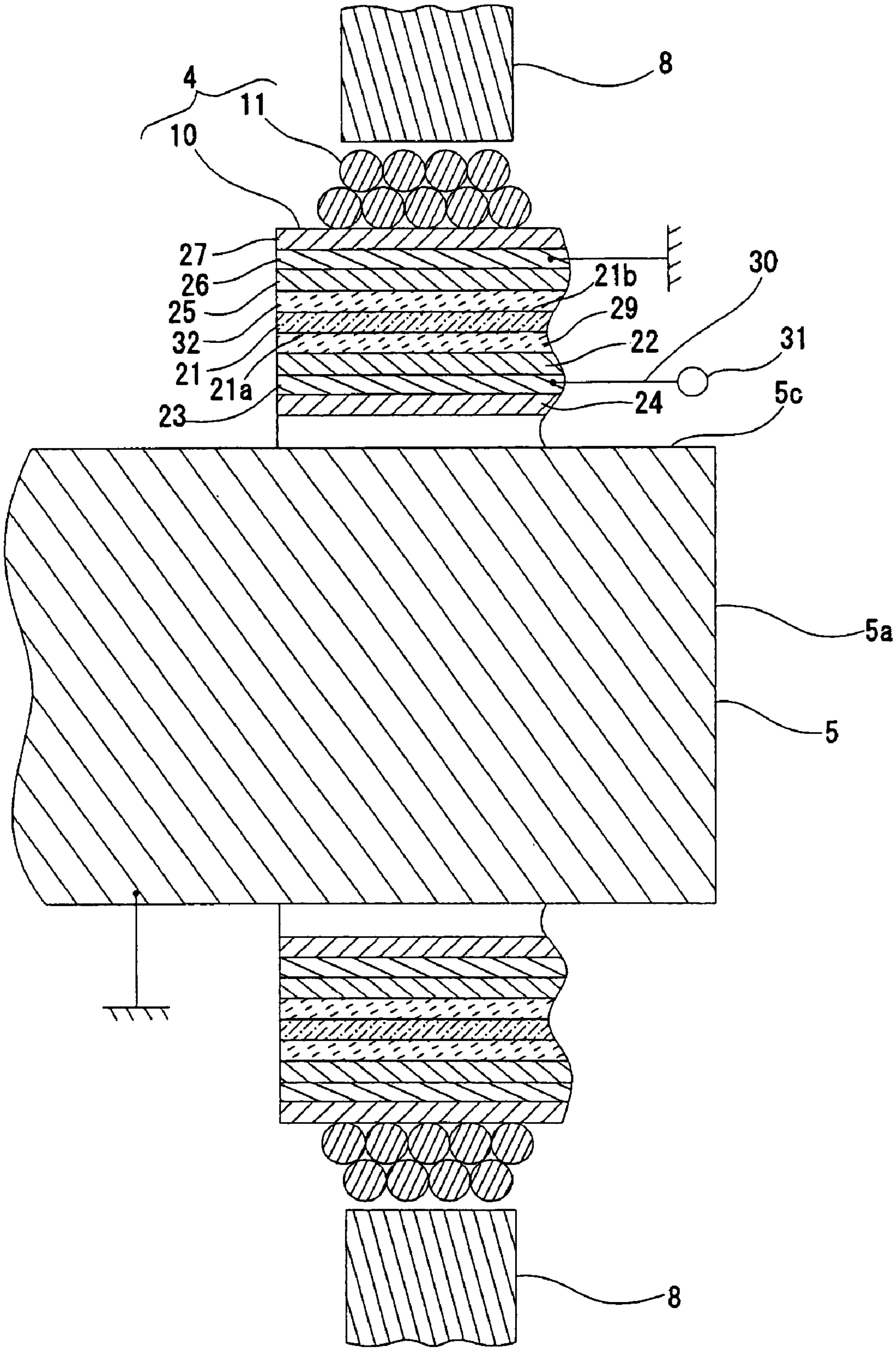
FIG. 3 is a cross-sectional view showing a structure of parts of a voice coil bobbin, a center pole and a yoke.

A speaker in accordance with an embodiment is shown in FIGS. 1 through 3. The speaker 1 in accordance with an embodiment detects an electrostatic capacity, which is formed between a voice coil bobbin 4 structured with a nonmetallic pipe body 21 as its base and a center pole 5, and the electrostatic capacity is outputted as an electric signal. A nonmagnetic inner side copper foil (first electric conductor film) 22 and a nonmagnetic inner side copper plating (first electric conductor film) 23 are formed on an inner peripheral face 21*a* of the pipe body 21, and an outer side copper foil (second electric conductor film) 25 and an outer side copper plating (second electric conductor film) 26 which surround the inner side copper foil 22 and the inner side copper plating 23 through the pipe body 21 are formed on the outer peripheral face 21*b* of the pipe body 21.

As shown in FIG. 1, the speaker 1 includes diaphragms 2, 3, the voice coil bobbin 4, the center pole 5, magnets 6, 7 and a yoke 8. A case 9 is formed in a measured shape. The center pole 5, the magnets 6, 7 and the yoke 8 are accommodated in the case 9 and these are fixed on an inner wall face of the case 9 with an adhesive or a screw. The center pole 5 is made of iron and includes a cylindrical main body 5*a* of the center pole 5 and a disk-shaped flange 5*b* which is formed at the base end of the main body 5*a* of the center pole 5. The center pole 5 is disposed in the case 9 such that the tip end portion of the main body 5*a* of the center pole 5 is protruded outside of the case 9 from the substantially center portion of the opening 9*a* of the case 9.

The center pole 5 and the case 9 are connected to a housing (not shown) that is referred to as an enclosure and are grounded. The ring-shaped magnet 6 is magnetically attracted to a face of the flange 5*b* which faces the opening 9*a* so as to surround the main body 5*a* of the center pole 5 as its center. The substantially disk-shaped yoke 8 is magnetically attracted to a face of the magnet 6 which faces the opening 9*a* and thus the magnet 6 is disposed in a state that the magnet 6 is sandwiched between the yoke 8 and the flange 5*b* of the center pole 5. The magnet 7 whose shape is the same as the magnet 6 is disposed between the face of the flange 5*b* that faces the bottom part 9*b* of the case 9 and the bottom part 9*b*. The magnet 7 is disposed on the bottom part 9*b* such that the pole of the magnet 7 on the side abutting with the flange 5*b* is the same pole of the magnet 6 on the side abutting with the flange 5*b*. According to the structure described above, a stable magnetic flux loop (described below) is formed between the magnet 7, the yoke 8 and the center pole 5.

The substantially disk-shaped yoke 8 is disposed so as to be substantially perpendicular to the axis in the longitudinal direction of the cylindrical main body 5*a* of the center pole 5. The yoke 8 is magnetically attracted to the magnet 6 such that the inner peripheral face of the yoke 8 faces the outer peripheral face 5*c* of the main body 5*a* of the center pole 5 and an air gap is formed between the inner peripheral face of the yoke 8 and the outer peripheral face 5*c*. Further, the inner peripheral face of the substantially disk-shaped yoke 8 faces the main body 5*a* of the center pole 5 within the case 9 and the outer peripheral face of the yoke 8 is disposed to be positioned close to the inner wall face of the case 9.

The voice coil bobbin 4 comprises a tubular shaped bobbin 10 whose front end and rear end are opened and a coil 11 which is wound around the outer periphery of the bobbin 10. An electric conductor such as an enameled wire or a copper wire is preferably used as the coil 11 or another appropriate electric conductor may be used. The bobbin 10 is installed in the case 9 so as to be capable of sliding in a forward and backward direction (direction of the arrow "A" in FIG. 1) and thus the bobbin 10 is capable of vibrating in the forward and backward direction by an exciting operation described below. The inner side diameter of the bobbin 10 is set to be slightly larger than the outer side diameter of the main body 5*a* of the center pole 5 and the bobbin 10 surrounds around the main body 5*a* of the center pole 5. In other words, the coil 11 is arranged to face the inner peripheral face of the yoke 8 and the bobbin 10 surrounds around the main body 5*a* of the center pole 5 such that the inner peripheral face of the bobbin 10 is substantially parallel to the outer peripheral face 5*c* of the main body 5*a* of the center pole 5. Therefore, the inner peripheral face of the yoke 8 is located in proximity to the coil 11 and the inner peripheral face of the bobbin 10 is located in proximity to the outer peripheral face 5*c* of the main body 5*a* of the center pole 5. Accordingly, a constant magnetic flux loop is always formed between the magnet 6, the yoke 8 and the center pole 5 in a circular arrow direction as shown in FIG. 1. The magnet 6 and the yoke 8 may be appropriately disposed at positions where a constant magnetic flux can be formed between the center pole 5, the magnet 6 and the yoke 8. Therefore, their disposing positions are not limited to this embodiment.

The frame 12 is bonded with an adhesive to the face of the yoke 8 which is exposed on the outer side of the case 9. Further, the frame 12 is bonded with a screw or an adhesive to the housing (not shown) and is grounded. The diaphragms 2, 3 are attached to the bobbin 10. The diaphragm 2 is a thin plate provided with a plurality of bent portions. One end of the diaphragm 2 is bonded to the outer peripheral face of the bobbin 10 and the other end of the diaphragm 2 is bonded to the frame 12 with an adhesive. The diaphragm 3 serves as a so-called cone paper. One end of the diaphragm 3 is connected to the outer peripheral face of the bobbin 10 and the other end of the diaphragm 3 is connected to the frame 12 through a joint 13. A center cap 14 is made of aluminum or the like and comprises a main body part which is formed in a dome shape and a flange part which is formed along the outer circumferential edge of the main body part. The flange part of the center cap 14 is bonded to the diaphragm 3 with an adhesive. Therefore, the opening 10*a* of the bobbin 10 is covered by the center cap 14.

As shown in FIG. 2, an electric signal showing audio information (hereinafter, referred to as "audio signal") that is inputted into an input terminal 15 is inputted to a power amplifier 17 through a comparator 16 that is comprised of a CPU (Central Processing Unit). The audio signal that is amplified with the power amplifier 17 is inputted into the voice coil bobbin 4. In other words, an electric current showing an audio signal flows through the coil 11 of the voice coil bobbin 4 and the voice coil bobbin 4 is vibrated in a forward and backward direction (direction shown by the arrow "A" in FIG. 1) by an exciting operation between the electric current and the magnetic flux which is formed between the center pole 5, the magnet 6 and the yoke 8. As a result, the diaphragms 2, 3 vibrate and a sound or the like is emitted from the speaker 1.

A detector 18, a converter 19 and a feedback circuit 20 are provided in the speaker 1. The detector 18 is a so-called capacitor that is comprised of the center pole 5 and an inner side copper plating 23 (see FIG. 3) of the voice coil bobbin 4 that together function as the capacitor of the detector 18, and an electrostatic capacity is formed with this capacitor. The electrostatic capacity that is formed between the center pole 5 and the inner side copper plating 23 is inputted into the converter 19 as an electric signal from the detector 18. The converter 19 amplifies the electric signal inputted from the detector 18 and the amplified electric signal is inputted into the comparator 16 as a detection signal through the feedback circuit 20. The comparator 16 compares an audio signal inputted from the input terminal 15 with the detection signal in response to the inputted detection signal. Then, the output level of the audio signal and the output level of the detection signal are compared with each other and the compared result, i.e., the difference, is calculated. Next, the power amplifier 17 regulates the output level of the audio signal on the basis of the calculated result and the audio signal is inputted into the voice coil bobbin 4. The voice coil bobbin 4 vibrates on the basis of the audio signal that is inputted from the power amplifier 17. In accordance with an embodiment, the converter 19 comprises an inductor, an oscillation circuit, a detector circuit, a low pass filter and the like, which are not shown in the drawing. Further, the feedback circuit 20 comprises an integration circuit, a buffer amplifier, an electronic volume, an adding circuit and the like, which are not shown in the drawing.

As shown in FIG. 3, the bobbin 10 comprises the pipe body 21, the inner side copper foil (first electric conductor film) 22, the inner side copper plating (first electric conductor film) 23, the inner side resist (insulator film) 24, the outer side copper foil (second electric conductor film) 25, the outer side copper plating (second electric conductor film) 26 and the outer side resist (insulator film) 27.

Figure 4:
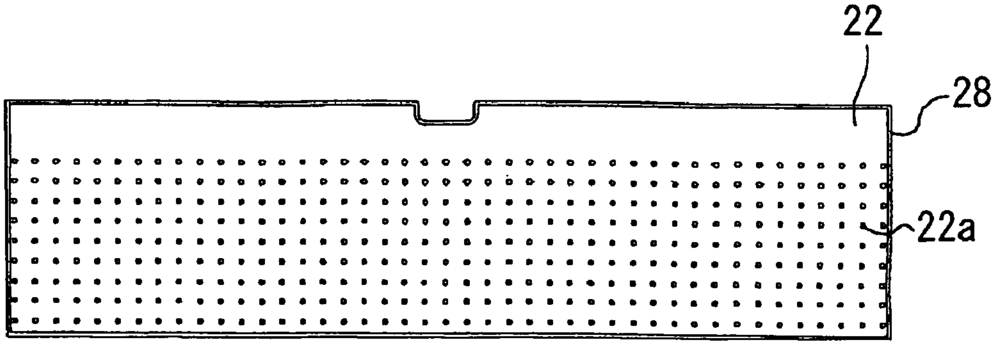
FIG. 4 is a plan view showing a structure of an inner side copper foil.
Figure 5:
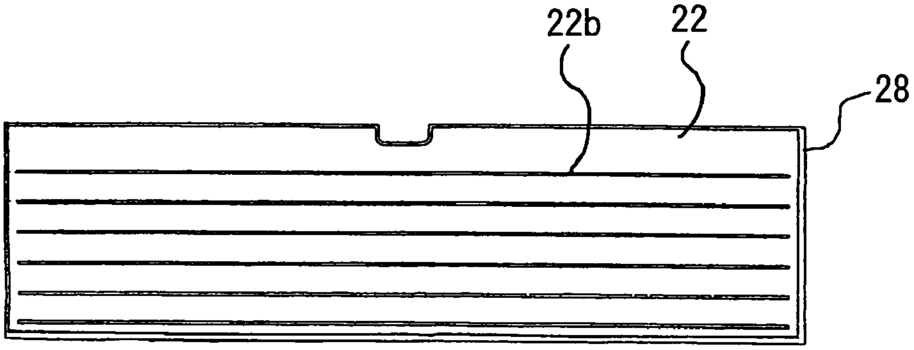
FIG. 5 is a plan view showing another structure of an inner side copper foil.
Figure 6:
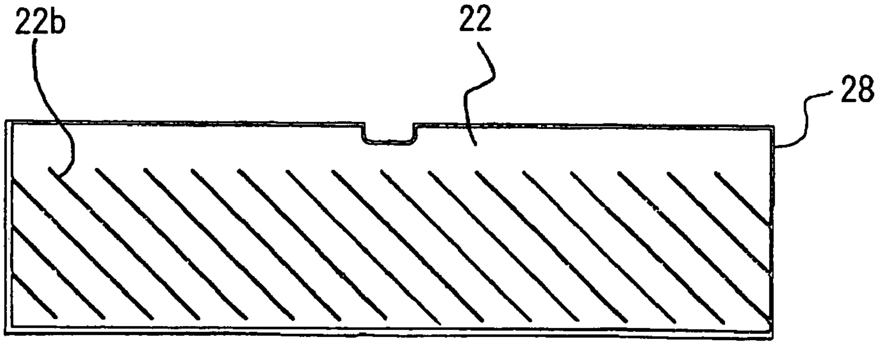
FIG. 6 is a plan view showing another structure of an inner side copper foil.
Figure 7:
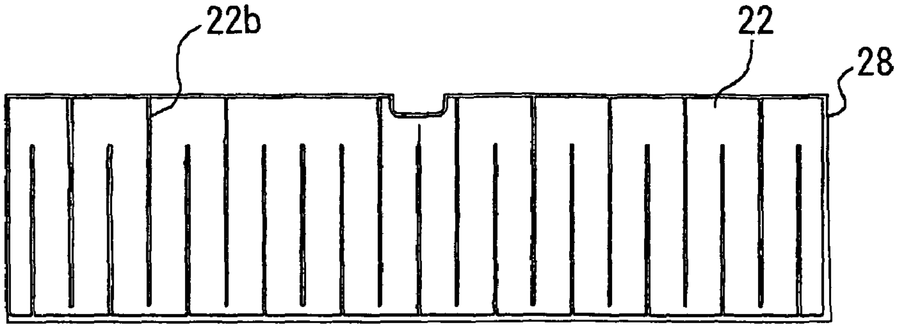
FIG. 7 is a plan view showing another structure of an inner side copper foil.

The pipe body 21, which serves the base of the voice coil bobbin 4, is structured by forming a roughly strip-shaped sheet 28 made of polyimide into a cylindrical shape as shown in FIG. 4. The inner side copper foil 22 corresponding to the size and the shape of the sheet 28 is bonded to one of the faces of the sheet 28, i.e., the inner peripheral face 21*a* of the pipe body 21 with an adhesive 29 (see FIG. 3). A plurality of circular-shaped holes 22*a* is formed in the inner side copper foil 22 in a transverse direction and a longitudinal direction with a constant pitch in a matrix manner. The holes 22*a* are not necessary to be disposed in the inner side copper foil 22 in a regular manner and may be disposed in an irregular manner. Further, as shown in FIGS. 5 through 7, a plurality of slits 22*b* may be formed in the inner side copper foil 22. In this case, the slits 22*b* may be disposed, as shown in FIG. 5, in a longitudinal direction of the inner side copper foil 22. Further, as shown in FIG. 6, the slits 22*b* may be disposed in an inclined manner. Further, as shown in FIG. 7, the slits 22*b* may be formed from alternately different sides. As described above, the arrangement of the slits 22*b* formed in the inner side copper foil 22 may be appropriately modified.

An inner side copper plating 23 is coated as shown in FIG. 3 on the inner side copper foil 22 that is formed as described above. Therefore, a copper film layer comprising the inner side copper foil 22 and the inner side copper plating 23 is formed. An inner side resist 24 made of rubber is coated on the inner side copper plating 23 in a film-like manner. Further, a terminal 31 is connected to the inner side copper plating 23 that is formed on the inner side copper foil 22 through a lead wire 30 that is fixed by soldering. The terminal 31 is connected to a converter 19. Therefore, an electric signal showing an electrostatic capacity that is formed between the voice coil bobbin 4 and the main body 5*a* of the center pole 5, i.e., between the inner side copper plating 23 and the outer peripheral face 5*c* of the main body 5*a* of the center pole 5 is inputted into the converter 19.

Figure 8:
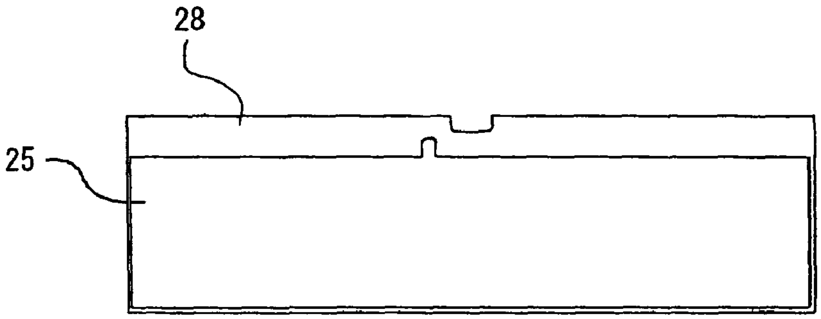
FIG. 8 is a plan view showing a structure of an outer side copper foil.

As shown in FIG. 8, a substantially strip-shaped outer side copper foil 25 is bonded with an adhesive 32 to the other face of the sheet 28, i.e., on a face which is the outer peripheral face 21*b* of the pipe body 21 (see FIG. 3) so as to correspond to the inner side copper foil 22. As shown in FIG. 3, an outer side copper plating 26 is coated on the outer side copper foil 5. Therefore, a copper film layer comprising the outer side copper foil 25 and the outer side copper plating 26 is formed on the outer peripheral face 21*b* of the pipe body 21. Further, the outer side copper plating 26 is connected to the above-mentioned housing (not shown) and is grounded. An outer side resist 27 made of rubber is coated on the outer side copper plating 26 in a film-like manner.

As described above, the inner side copper foil 22, the inner side copper plating 23 and the inner side resist 24 are successively laminated on the one face of the sheet 28, i.e., on the inner peripheral face 21*a* of the pipe body 21. The outer side copper foil 5, the outer side copper plating 26 and the outer side resist 27 are successively laminated on the other face of the sheet 28, i.e., on the outer peripheral face 21*b* of the pipe body 21. After that, both end portions in the longitudinal direction of the sheet 28 in FIG. 4 are affixed to each other with an adhesive and formed in a cylindrical shape to structure the bobbin 10. When the bobbin 10 is formed as described above, the outer side copper foil 25 and the outer side copper plating 26 are formed on the outer peripheral face 21*b* of the pipe body 21 so as to cover the inner side copper foil 22 and the inner side copper plating 23 through the pipe body 21. Further, the coil 11 is wound around the outer peripheral face of the bobbin 10, i.e., around the outer side resist 27 to form the voice coil bobbin 4.

As described above, according to the speaker 1 having the structure shown in FIGS. 1 through 5, when an audio signal is inputted into an input terminal 15, the voice coil bobbin 4 vibrates on the basis of the audio signal to cause the diaphragms 2, 3 to vibrate. The speaker 1 generates a sound and the like according to the vibration of the diaphragms 2, 3. The operating state of the diaphragms 2, 3 at this time is recognized by detecting an electrostatic capacity that is formed between the voice coil bobbin 4 and the main body 5*a* of the center pole 5. In other words, the facing area of the inner side copper plating 23 of the voice coil bobbin 4 to the outer peripheral face 5*c* of the main body 5*a* of the center pole 5 varies to cause an electrostatic capacity formed between the outer side copper plating 32 and the outer peripheral face 5*c* to vary. The variation of the electrostatic capacity corresponds to the displacement of the diaphragms 2, 3. The electrostatic capacity detected in this manner is very minute (about several pF through several hundred pF). Therefore, in the conventional speaker, the detected electrostatic capacity may vary due to the effect of disturbance noise such as a magnetic field generated by a current flowing through the coil 11 or an electromagnetic wave outputted from various electronic devices (not shown) constructing the speaker.

However, in the speaker 1 in accordance with an embodiment of the present invention, since the outer side copper foil 25 and the outer side copper plating 26 are formed on the outer peripheral face 21*b* of the pipe body 21, an electric current flowing through the coil 11, an electromagnetic wave entering from the outside and the like can be blocked. Further, since the outer side resist 27 is formed between the outer side copper plating 26 and the coil 11, the outer side copper plating 26 and the coil 11 can be electrically insulated by the outer side resist 27. Therefore, an electric current flowing through the coil 11 may not conduct through the outer side copper plating 26 and the outer side copper foil 25. Further, since the outer side copper plating 26 is grounded, an electric current flowing in the coil 11 or an electromagnetic wave from the outside are absorbed by the outer side copper plating 26. In addition, since the inner side resist 24 is disposed between the outer side copper plating 26 and the outer peripheral face 5*c* of the main body 5*a* of the center pole 5, the relative permittivity of the capacitor which is formed by the outer side copper plating 26 and the main body 5*a* of the center pole 5 increases. In other words, the electrostatic capacity can be increased. Therefore, a real electrostatic capacity which is formed between the outer side copper plating 26 and the outer peripheral face 5*c* of the main body 5*a* of the center pole 5 can be accurately detected without being affected by a current flowing in the coil 11, an electromagnetic wave entering from the outside, or the like.

Further, when an electric conductor is moved in a constant magnetic field, an eddy current commonly flows in the surface of the electric conductor. However, in accordance with an embodiment, the inner side copper foil 22 and the inner side copper plating 23 are formed on the inner peripheral face 21*a* of the pipe body 21 and the copper film layer comprising the outer side copper foil 25 and the outer side copper plating 26 is formed on the outer peripheral face 21*b* of the pipe body 21. Therefore, a circuit where an eddy current flows is cut off and the current can be effectively confined in individual film layers and thus the eddy current can be suppressed. In addition, a plurality of holes 22*a* is formed in the inner side copper foil 22 that is a foil member in or over roughly the entire region and at a roughly equal interval and thus the circuit for the eddy current can be cut off by the holes 22*a* and the eddy current can be further suppressed by the holes 22*a*. Therefore, a real electrostatic capacity that is formed between the outer side copper plating 26 and the outer peripheral face 5*c* of the main body 5*a* of the center pole 5 can be further accurately detected without being affected by the eddy current.

Figure 9:
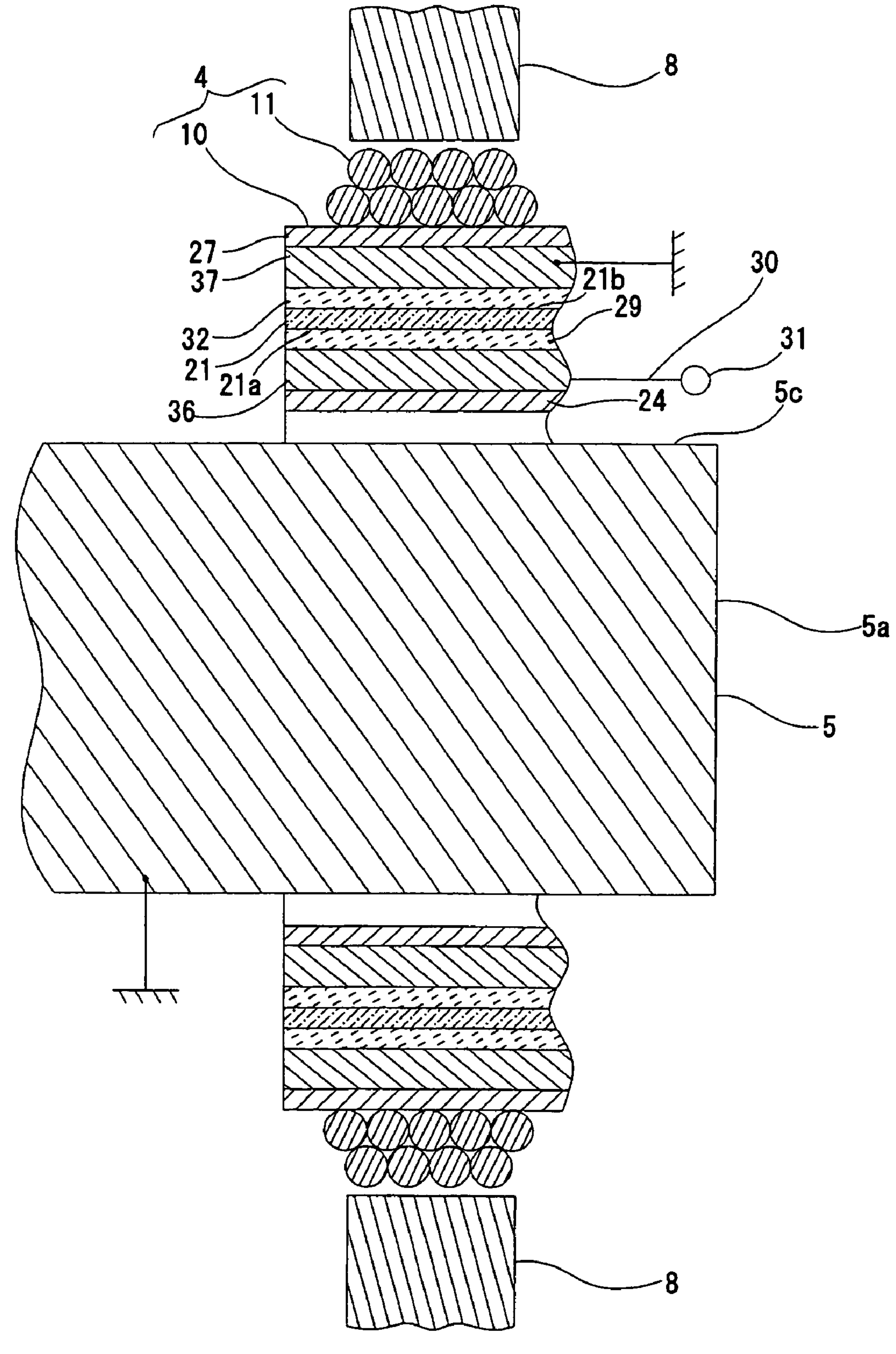
FIG. 9 is a cross-sectional view showing a structure of parts of a voice coil bobbin, a center pole and a yoke in accordance with another embodiment of the present invention.

The present invention has been described in detail using the embodiments, but the present invention is not limited to the embodiments described above and many modifications can be made without departing from the present invention. For example, as shown in FIG. 9, an inner side copper foil 36 which is similarly formed to the inner side copper foil 22 is fixed to the inner peripheral face 21*a* of the pipe body 21 and an inner side resist 24 is further fixed to the inner side copper foil 36. Further, an outer side copper foil 37 which is similarly formed to the above-mentioned outer side copper foil 25 is fixed to the outer peripheral face 21*b* of the pipe body 21 so as to cover the inner side copper foil 36 through the pipe body 21 and an outer side resist 27 is further fixed to the outer side copper foil 37. In addition, similar to the embodiment described above, the outer side copper foil 37 is grounded and a terminal 31 is connected to the inner side copper foil 36 through a lead wire 30. According to the structure as described above, similar to the above-mentioned embodiment, entry of an electromagnetic wave from the outside and conduction of a current flowing through the coil 11 can be shielded by the outer side copper foil 37.

Further, in the embodiment described above, the inner side copper foil 22 in which a plurality of holes 22*a* is formed over the almost entire region in a substantially equal interval is used. However, the present invention is not limited to this embodiment. A pattern that combines the holes 22*a* and a plurality of slits 22*b* shown in FIG. 5, 6 or 7 may be formed in a copper foil over the almost entire region in a substantially equal interval to be used. Further, the patterns of the slits 22*b* shown in FIGS. 5 through 7 may be combined with each other to be used. Further, in the embodiment described above, the holes 22*a* are formed in a circular shape but their shape, size, number and the like may be appropriately set according to various conditions such as the size of the copper foil, the strength of the copper foil, and the magnitude of an eddy current that may be generated in the copper foil. The shape, size, number and the like of the holes 22*a* are preferable when they are effective to cut off the circuit of an eddy current which is formed in the copper foil. Further, the width, shape, arrangement, combination, number and the like of the slits 22*b* which are shown in respective FIGS. 5 through 7 may be appropriately set according to various conditions such as the size of the copper foil, the strength of the copper foil and the magnitude of an eddy current that may be generated in the copper foil. The width, shape, arrangement, combination, number and the like of the slits 22*b* are preferable when they are effective to cut off the circuit of an eddy current which is formed in the copper foil.

In the embodiment described above, a plurality of the holes 22*a* is formed in the inner side copper foil 22 which is a foil member. However, the present invention is not limited to this embodiment and similar holes as described above and similar slits to the slits 22*b* shown in FIGS. 5 through 7 may be formed in the outer side copper foil 25 which is a foil member. According to the structure as described above, an eddy current which is generated in the outer side copper foil 25 can be further surely suppressed.

In the embodiment described above, a double (two-layer) copper film layer comprising of the inner side copper foil 22 and the inner side copper plating 23 is formed on the inner peripheral face 21*a* of the pipe body 21, and a double copper film layer comprising of the outer side copper foil 25 and the outer side copper plating 26 is formed on the outer peripheral face 21*b* of the pipe body 21. However, the present invention is not limited to this embodiment and three layers or four layers of copper film layer may be formed and the number of laminated layers may be appropriately changed.

In the embodiment described above, the inner side copper foil 22 is stuck on the inner peripheral face 21*a* of the pipe body 21 and, in addition, the inner side copper plating 23 is coated on the inner side copper foil 22, and further, the outer side copper foil 25 is stuck on the outer peripheral face 21*b* of the pipe body 21 and, in addition, the outer side copper plating 26 is coated on the outer side copper foil 25. Therefore, the copper film layers are formed on the inner peripheral face 21*a* and the outer peripheral face 21*b* of the pipe body 21, respectively. However, the copper film layer may be formed on each of the inner peripheral face 21*a* and the outer peripheral face 21*b* of the pipe body 21 by evaporating copper. In this manner, a method for forming the copper film layer can be changed appropriately.

In the embodiment described above, a coating process is used to form the inner side resist 24 on the inner side copper plating 23 and to form the outer side resist 27 on the outer side copper plating 26. However, the inner side resist 24 and the outer side resist 27 that are formed in a film shape may be stuck on the inner side copper plating 23 and the outer side copper plating 26 with an adhesive. As described above, the respective resists may be formed in a film-like manner and a method for forming the resist may be changed appropriately.

In the embodiment described above, the copper film layer is formed on the inner peripheral face 21*a* and the outer peripheral face 21*b* of the pipe body 21. However, the present invention is not limited to this embodiment. For example, an aluminum layer made of aluminum or an electro-conductive plastic layer may be formed on the inner peripheral face 21*a* and the outer peripheral face 21*b* of the pipe body 21. A nonmagnetic and electric conductor film may be formed on the inner peripheral face 21*a* and the outer peripheral face 21*b* of the pipe body 21 and the material of the film layer may be changed appropriately.

In the embodiment described above, the pipe body 21 is structured by using polyimide but its material is not limited to polyimide. For example, the material of the pipe body 21 may be paper or appropriately changed when the pipe body 21 is structured by using an insulator.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A speaker comprising:

a voice coil bobbin comprising:

a nonmetallic pipe body as a base of the voice coil bobbin;

a first nonmagnetic electric conductor film that is formed on an inner peripheral face of the pipe body;

a second electric conductor film that is formed on an outer peripheral face of the pipe body such that the first electric conductor film is covered by the second electric conductor film through the pipe body; and a center pole;

wherein an electrostatic capacity that is formed between the voice coil bobbin and the center pole is detected and outputted as an electrical signal, and wherein an inner side insulator film is formed on an inner peripheral face of the first electric conductor film, and an electrostatic capacity which is formed between the first electric conductor film and the center pole is detected, and an outer side insulator film is formed on an outer peripheral face on the second electric conductor film, and a coil is wound around an outer peripheral face of the outer side insulator film to structure the voice coil bobbin.

2. The speaker according to claim 1, further comprising insulator films respectively formed on the first and the second electric conductor films.

3. The speaker according to claim 1, wherein the second electric conductor film is grounded.

4. The speaker according to claim 1, wherein at least one of the first electric conductor film and the second electric conductor film is formed of laminated films.

5. The speaker according to claim 1, wherein at least one of the first electric conductor film and the second electric conductor film is provided with at least one of a plurality of slits and a plurality of holes.

6. A speaker comprising:

a voice coil bobbin comprising:

a nonmetallic pipe body as a base of the voice coil bobbin;

a first nonmagnetic electric conductor film that is formed on an inner peripheral face of the pipe body;

a second electric conductor film that is formed on an outer peripheral face of the pipe body such that the first electric conductor film is covered by the second electric conductor film through the pipe body; and a center pole;

wherein an electrostatic capacity that is formed between the voice coil bobbin and the center pole is detected and outputted as an electrical signal, wherein an inner side insulator film is formed on an inner peripheral face of the first electric conductor film, and an electrostatic capacity which is formed between the first electric conductor film and the center pole is detected, and an outer side insulator film is formed on an outer peripheral face on the second electric conductor film, and a coil is wound around an outer peripheral face of the outer side insulator film to structure the voice coil bobbin, and wherein the second electric conductor film is grounded.

7. A speaker comprising:

a voice coil bobbin comprising:

a nonmetallic pipe body as a base of the voice coil bobbin;

a first nonmagnetic electric conductor film that is formed on an inner peripheral face of the pipe body;

a second electric conductor film that is formed on an outer peripheral face of the pipe body such that the first electric conductor film is covered by the second electric conductor film through the pipe body; and a center pole;

wherein an electrostatic capacity that is formed between the voice coil bobbin and the center pole is detected and outputted as an electrical signal, wherein an inner side insulator film is formed on an inner peripheral face of the first electric conductor film, and an electrostatic capacity which is formed between the first electric conductor film and the center pole is detected, and an outer side insulator film is formed on an outer peripheral face on the second electric conductor film, and a coil is wound around an outer peripheral face of the outer side insulator film to structure the voice coil bobbin, wherein the second electric conductor film is grounded, and wherein the first electric conductor film is comprised of a plurality of electric conductor films which is laminated.

* * * * *